(12) United States Patent
Ogilvie et al.

(10) Patent No.: US 7,913,222 B2
(45) Date of Patent: Mar. 22, 2011

(54) AUTOMATIC GENERATION OF CODE FOR COMPONENT INTERFACES IN MODELS

(75) Inventors: Brian K. Ogilvie, Holliston, MA (US); John Zhao, Salem, NH (US); Bharath Venkateraman, Sudbury, MA (US)

(73) Assignee: The Mathworks, Inc., Natick, MA (US)

( * ) Notice: Subject to any disclaimer, the term of this patent is extended or adjusted under 35 U.S.C. 154(b) by 876 days.

(21) Appl. No.: 11/012,936

(22) Filed: Dec. 14, 2004

(65) Prior Publication Data

US 2006/0064669 A1  Mar. 23, 2006

Related U.S. Application Data

(60) Provisional application No. 60/611,909, filed on Sep. 20, 2004.

(51) Int. Cl.
*G06F 9/44* (2006.01)
*G05F 3/00* (2006.01)

(52) U.S. Cl. ........ 717/106; 717/120; 717/124; 717/135; 710/8; 703/13; 703/22

(58) Field of Classification Search ........................ None
See application file for complete search history.

(56) References Cited

U.S. PATENT DOCUMENTS

| | | | | |
|---|---|---|---|---|
| 6,058,263 | A * | 5/2000 | Voth | 703/25 |
| 6,553,554 | B1 * | 4/2003 | Dahl et al. | 716/11 |
| 6,564,363 | B1 * | 5/2003 | Dahl et al. | 716/11 |
| 6,718,421 | B1 * | 4/2004 | Conroy | 710/305 |
| 7,272,546 | B1 * | 9/2007 | Brown et al. | 703/13 |
| 2003/0195732 | A1 * | 10/2003 | Kodosky et al. | 703/2 |
| 2005/0216247 | A1 * | 9/2005 | Ikeda et al. | 703/19 |
| 2008/0141227 | A1 * | 6/2008 | Waters et al. | 717/140 |

OTHER PUBLICATIONS

Wingard et al., "Integration Architecture for System-on-a-Chip Design", 1998 IEEE, pp. 85-88 (International Search Report—PCT/US2005/033848).*

Choi et al., "Exploiting Intellectual Properties in ASIP Designs for Embedded DSP Software", 1999 ACM, pp. 939-944 (International Search Report—PCT/US2005/033848).*

D'silva, "Bridge Over Troubled Wrappers: Automated Interface Synthesis", 2004 IEEE, pp. 1-6 (International Search Report—PCT/US2005/033848).*

Choi et al., "Exploiting Intellectual Properties in ASIP Designs for Embedded DSP Software", 1999 ACM, pp. 939-944.*

(Continued)

*Primary Examiner* — Michael J Yigdall
*Assistant Examiner* — Ben C Wang
(74) *Attorney, Agent, or Firm* — Harrity & Harrity, LLP (57) ABSTRACT

Methods, systems and computer program products are disclosed for automatically generating hardware description language code from a model. The hardware description language code may be generated from a graphical program/model, such as a block diagram model. The hardware description language code may also be generated from a text-based program/model, such as a model created using MATLAB® tools. In particular, the present invention provides for the automatic code generation of an interface between components in the model. The present invention may provide options for selecting at least one of multiple types or styles of the component interfaces in the model. The selection of the interface types or styles may be controlled by the user or inferred by other parameters, such as implementation parameters.

37 Claims, 4 Drawing Sheets

OTHER PUBLICATIONS

Matthias Gries, "Methods for evaluating and covering the design space during early design development", Jun. 3, 2004, Elsevier, pp. 131-183.*

Donno et al., "Power-Aware Clock Tree Planning", Apr. 18, 2004, ACM, pp. 138-147.*

Donno et al., "Clock-Tree Power Optimization based on RTL Clock-Gating", Jun. 2, 2003, ACM, pp. 622-627.*

Choi, Hoon et al, "Exploiting Intellectual Properties in ASIP Designs for Embedded DSP Software," Design Automation, 1999. 36th Annual Conference on New Orleans, LA, USA Jun. 21-25, 1999, Piscataway, NJ, USA, IEEE, pp. 939-944.

D'Silva, Vijay et al, "Bridge Over Troubled Wrappers: Automated Interface Synthesis," VLSI Design, 2004, Proceedings, 17th International Conference on Mumbai, India, Jan. 5-9, 2004, Los Alamitos, CA, USA, IEEE Comput. Soc. U.S., pp. 189-194.

Wingard, Drew et al, "Integration Architecture for System-on-a-Chip Design," Custom Integrated Circuits Conference. Proceedings of the IEEE Santa Clara, CA, USA May 11-14, 1998, New York, NY, USA, IEEE, US, pp. 85-88.

International Search Report for Application No. PCT/US2005/033848, dated Apr. 21, 2006.

* cited by examiner

| | Interface A | Interface B | Interface C |
|---|---|---|---|
| Low Power | ✓ | | ✓ |
| High Clock Rate | ✓ | ✓ | |
| Low Implementation Area | | ✓ | ✓ |

*Fig. 7*

AUTOMATIC GENERATION OF CODE FOR COMPONENT INTERFACES IN MODELS

RELATED APPLICATIONS

The present application claims priority to a U.S. provisional application, Patent Application No. 60/611,909 filed Sep. 20, 2004, the contents of which are incorporated herein by reference.

FIELD OF THE INVENTION

The present invention relates generally to code generation and more particularly to methods, systems and computer program products for automatically generating code for component interfaces in a model.

BACKGROUND OF THE INVENTION

Historically, engineers and scientists have utilized text-based or graphical programs/models in numerous scientific areas such as Feedback Control Theory and Signal Processing to study, design, debug, and refine dynamic systems. Dynamic systems, which are characterized by the fact that their behaviors change over time, are representative of many real-world systems. Text-based or graphical programming/modeling has become particularly attractive over the last few years with the advent of software packages, such as MATLAB®, and Simulink®, both from The MathWorks, Inc. of Natick, Mass. Such packages provide sophisticated software platforms with a rich suite of support tools that makes the analysis and design of dynamic systems efficient, methodical, and cost-effective.

Using the models or algorithms, an engineer or scientist can analyze the behavior of a circuit before the circuit is built. When the engineer or scientist determines the behavior of the circuit, then the models or algorithms are represented in Hardware Description Language (HDL) code to implement the circuit. HDL refers to any language from a class of computer languages for formal description of hardware. It can describe hardware operation, its design, and tests to verify its operation by means of simulation. HDL code is a standard text-based expression of the temporal behaviour and/or (spatial) structure of the hardware. HDL's syntax and semantics include explicit notations for expressing time and concurrency which are the primary attributes of hardware.

Using the hardware description in HDL code, a software program called an hardware synthesis tool can infer hardware logic operations from the hardware description statements and produce an equivalent netlist of generic hardware primitives to implement the specified behaviour. However, designing hardware systems in HDL code is generally difficult and as a result time consuming. Therefore, there is a need for a process for automatically generating HDL code for hardware systems.

SUMMARY OF THE INVENTION

The present invention provides systems, methods and computer program products for automatically generating HDL code from a model. The HDL code may be generated from a graphical program/model, such as a block diagram model. The HDL code may also be generated from a text-based program/model, such as a model created using MATLAB® tools. In particular, the present invention provides for the automatic code generation of interfaces between components in the model. The present invention may provide options for selecting types or styles of the component interfaces in the model. The selection of the interface types or styles can be controlled by the user or can be inferred by certain model parameters, such as power parameters, required throughput and/or clock parameters, and circuit area or size parameters. Once the interface types or styles are determined, HDL code for the component interfaces is automatically generated that comply with the determined interface types or styles.

In one aspect of the present invention, a method is provided for generating code from a model in a computing device. The method includes the step of determining an interface between a portion of a first component of the model and a portion of a second component of the model. The method also includes the step of automatically generating code representative of the interface between the portion of the first component and the portion of the second component of the model. When the code for the interface between the components of the model is compiled, an output of the compiler is used to implement the interface in a hardware component.

In another aspect of the present invention, a system is provided for generating code from a model. The system includes a user interface for enabling users to create the model. The system also includes a code generator for determining an interface between a portion of a first component of the model and a portion of a second component of the model. The code generator automatically generates code representative of the interface between the portion of the first component and the portion of the second component of the model. When the code for the interface between the components of the model is compiled, an output of the compiler is used to implement the interface in a hardware component.

In another aspect of the present invention, a computer program product is provided for holding instructions executable to perform a method in a computer. The method includes the step of determining an interface between a portion of a first component of the model and a portion of a second component of the model. The method also includes the step of automatically generating code representation of the interface between the portion of the first component and the portion of the second component of the model. When the code for the interface between the components of the model is compiled, an output of the compiler is used to implement the interface in a hardware component.

BRIEF DESCRIPTION OF THE DRAWINGS

The aforementioned features and advantages, and other features and aspects of the present invention, will become better understood with regard to the following description and accompanying drawings, wherein.

DETAILED DESCRIPTION

Certain embodiments of the present invention are described below. It is, however, expressly noted that the present invention is not limited to these embodiments, but rather the intention is that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The illustrative embodiment of the present invention provides for automatic code generation from a text-based or graphical program/model. The terms "program/programming" and "model/modeling" will be interchangeably used in the description of the illustrative embodiment. The illustrative embodiment automatically generates code for the hardware description of the program/model. The hardware description can be generated in Hardware Description Language (HDL) code, such as very high speed integrated circuit hardware description language (VHDL) code, SystemC code and Verilog code. Although the illustrative embodiment will be described below relative to HDL code, one of ordinary skill in the art will appreciate that the hardware description can be generated using other programming languages, such as C++, C and C#.

The HDL code can be generated from either a text-based or graphical program/model. As an exemplary graphical program/model, the illustrative embodiment will be described below solely for illustrative purposes relative to a block diagram model. One of ordinary skill in the art will appreciate that the block diagram model is illustrative and the present invention can apply to other graphical programs/models, such as data flow models, discrete-event models, and system-level modeling languages such as Unified Modeling Language (UML), as long as the graphical model has some notion of semantics that allows it to be transformed into an executable for a computer processor/microcontroller or directly synthesized in application-specific hardware.

An exemplary graphical program/model can be created in Simulink®, which provides tools for modeling and simulating a variety of dynamic systems in one integrated, graphical environment. Simulink® enables users to design a block diagram for a target system, simulate the system's behavior, analyze the performance of the system, and refine the design of the system. Simulink® allows users to design target systems through a user-interface that allows drafting of block diagram models of the target systems. All of the blocks in a block library provided by Simulink® and other programs are available to users when the users are building the block diagram of the target systems. Individual users may be able to customize this model to: (a) reorganize blocks in some custom format, (b) delete blocks they do not use, and (c) add custom blocks they have designed. The blocks can be copied from the block library on to the window (i.e., model canvas) through some human-machine interface (such as a mouse or keyboard).

The illustrative embodiment can also generate HDL code from a text-based program/model implemented using functional, object-oriented, or other design methodology. Such a model may be designed using, for example, textual object-oriented components provided by the Filter Design Toolbox from The MathWorks, Inc. of Natick, Mass. One of ordinary skill in the art will appreciate that the model designed using Filter Design Toolbox is illustrative and the present invention can apply to other text-based programs/models designed using other tools.

The Filter Design Toolbox provides tools and techniques for designing, simulating, and analyzing filters. The Filter Design Toolbox provides filter architectures and design methods for complex real-time DSP applications, including adaptive and multiple rate filtering. The Filter Design Toolbox also provides functions that simplify the design of fixed-point filters and the analysis of quantization effects. The Filter Design Toolbox enables users to generate HDL code, such as VHDL code and Verilog code, for fixed-point filters when it is used with the Filter Design HDL Coder, which will be described below in more detail with reference to FIG. 2.

The illustrative embodiment will be described below solely for illustrative purposes relative to a graphical program/model implemented using Simulink® and a text-based program/model implemented using Filter Design Toolbox. Nevertheless, those of skill in the art will appreciate that the present invention may be practiced relative to models implemented in other text-based or graphical programming/modeling tools, including but not limited to LabVIEW and Hyperception from National Instruments Corporation of Austin, Tex., Signal Processing Workbench (SPW) from CoWare, Inc. of San Jose, Calif., VisualSim from Mirabilis Design of Sunnyvale, Calif., and Rational Rose from IBM of White Plains, N.Y.

The illustrative embodiment of the present invention provides for the automatic HDL code generation for interfaces between components in a model. An interface between components refers to a collection of signals used to transfer information from one block to another block. There may be one or more subsets of the interface in which one or more signals are grouped. The interface between two components matches on both sides of the components. That is, the properties of the signals in the interface, such as the types, dimensions and sizes of the signals, on the side of one component are compatible with those of the signals on the side of the other component. The interface may include one or more signals that can be controlled by users and specifically depicted to the users in the model. The interface may also include one or more signals that are not controlled by the users and not specifically depicted to the users in the model, but are automatically added by design tools to control the transfer of the information between the components of the model.

Although one interface between two components of the model can be implemented in the real hardware of the model, multiple types or styles of the interface can be considered in the design process of the model. In the illustrative embodiment, options can be provided for selecting one or more types or styles of the component interfaces in the model. For example, in an exemplary block-diagram, one interface type or style can be configured to receive or transfer data every clock cycle. In another interface type or style, the transfer of data is flow-controlled by a clock-enable signal. The options may include many other interface types or styles. If multiple types or styles of the interface are available, the design tools may determine the final type or style of the interface using one or more selection criteria, such as a cost function, to achieve a user-specified goal such as low-power or high performance. In the description of the illustrative embodiment set forth below, the terms "interface types" and "interface styles" are interchangeably used to refer to the interfaces having different characteristics of signals between components in a model.

With some guidance from the users, any of the interface types or styles could be created in the HDL code. Alternatively, the selection of interface types or styles can be inferred by certain model parameters, such as implementation parameters including power parameters, clock parameters and implementation area or size parameters. Once the interface types or styles are determined, HDL code for the component interfaces is automatically generated that comply with the determined interface types or styles. When the code for the interface between the components of the model is compiled by a compiler, an output of the compiler is used to implement the interface in a hardware component.

Figure 1:
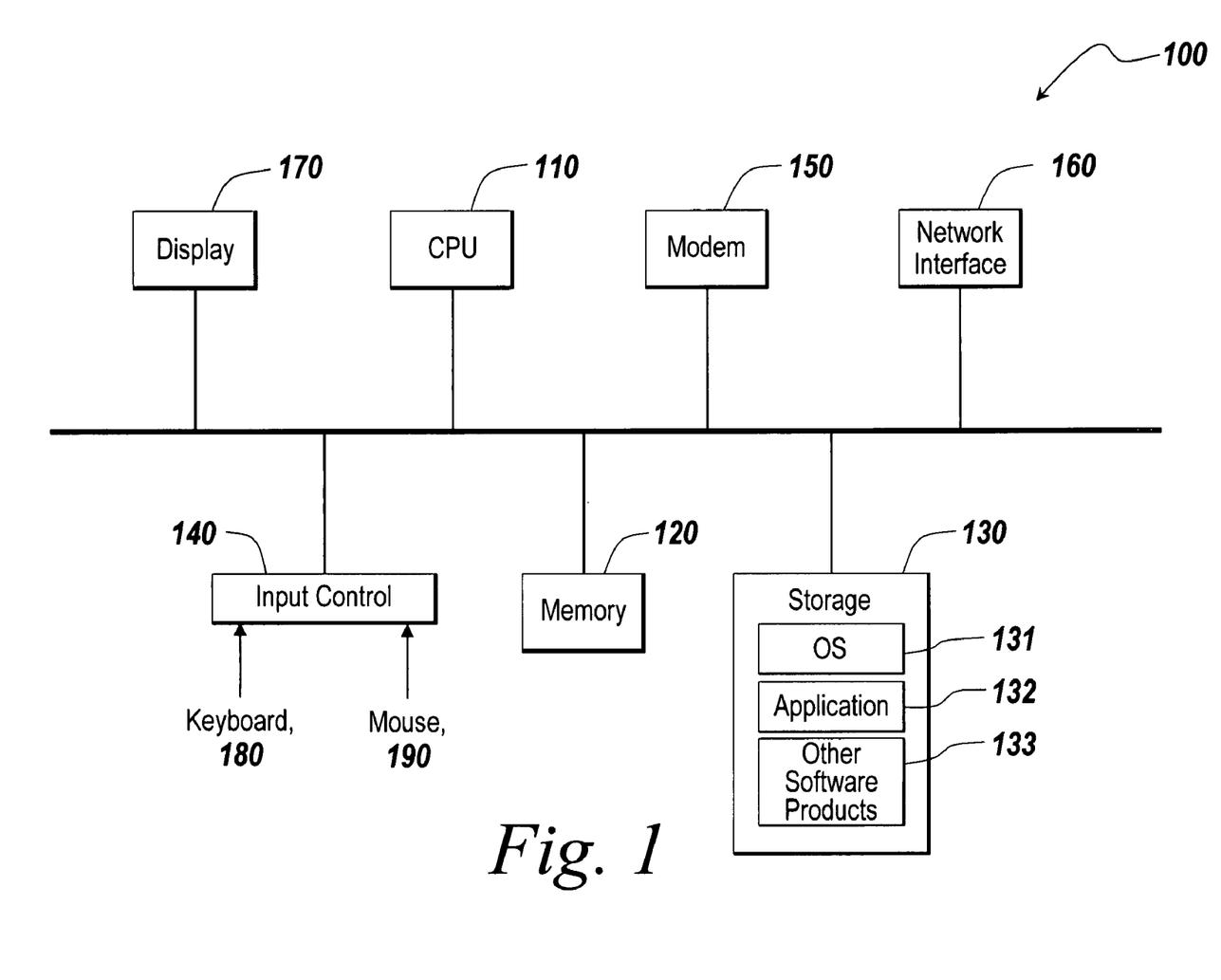
FIG. 1 is an exemplary computing device suitable for practicing the illustrative embodiment of the present invention.

FIG. 1 is an exemplary computing device 100 suitable for practicing the illustrative embodiment of the present invention. One of ordinary skill in the art will appreciate that the computing device 100 is intended to be illustrative and not limiting of the present invention. The computing device 100 can be an electronic device including but not limited to a workstation, server, network computer, Internet appliance, mobile device, a pager, a tablet computer, and the like.

The computing device 100 includes a network interface 160, a modem 150, storage 130, memory 120, a central processing unit (CPU) 110, a display 170, an input control 140, a keyboard 180 and a mouse 190. One of ordinary skill in the art will appreciate that the computing device 100 may be connected to communication networks using the modem 150 and network interface 160. The network interface 160 and the modem 150 enable the computing device 100 to communicate with other computing devices through communication networks, such as the Internet, an intranet, a LAN (Local Area Network), a WAN (Wide Area Network) and a MAN (Metropolitan Area Network).

The CPU 110 controls each component of the computing device 100 to run software tools for generating HDL code from a model. The computing device 100 receives input commands necessary for generating HDL code, such as the selection of HDL code languages, through the keyboard 180 or mouse 190. The computing device 100 may display the options for the types or styles of the component interfaces in the model. The memory 120 temporarily stores and provides to the CPU 110 the code that need to be accessed by the CPU 110 to operate the computing device 100 and to run the software tools. The storage 130 usually contains software tools for applications. The storage 130 includes, in particular, code 131 for an operating system, code 132 for applications, such as a code generator 230 and code 133 for data including the model and HDL code generated from the model. The code generator 230 will be described below in more detail with reference to FIG. 2.

Figure 2:
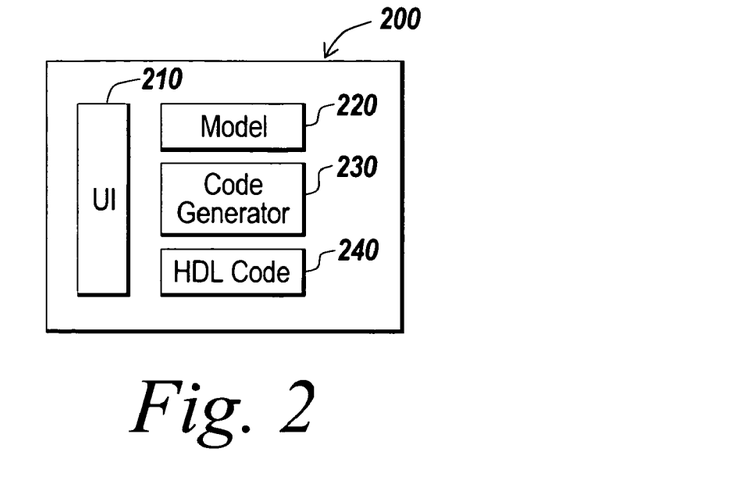
FIG. 2 is an exemplary environment for generating code from a model in the illustrative embodiment of the present invention.

FIG. 2 shows an exemplary environment 200 for generating HDL code 240 in the illustrative embodiment of the present invention. The environment 200 can be a modeling environment in which a model 220 can be created, simulated, executed and/or tested. The environment 200 can include a user interface 210 and a code generator 230. The user interface 210 can include a graphical user interface (GUI) and/or a command line interface (CLI) for allowing users to create the model 220 and enabling the code generator 230 to generate HDL code 240 from the model 220. The user interface 210 enables users to input data for the model 220. In particular, the user interface 210 can enable the users to input data necessary for generating the HDL code 240 from the model 220, such as data for selecting the language of the HDL code 240, such as VHDL code, SystemC code and Verilog code or other versions of HDL code. The user interface 210 may allow users to input parameters for selecting or defining the type or style of interfaces between the components in the model 220. The user interface 210 may also allow the users to input other parameters, such as implementation parameters including power parameters, clock parameters and implementation area or size parameters. The code generator 230 generates the HDL code 240 based on the data entered or selected by the users using the user interface 210.

An exemplary code generator 230 can be found in Filter Design HDL Coder from The MathWorks, Inc. of Natick, Mass. The Filter Design HDL Coder generates HDL code and test benches for filters that users design and create. The Filter Design HDL Coder enables users to generate VHDL code or Verilog code for filters designed with the Filter Design Toolbox for implementation in application-specific integrated circuit (ASIC) or field programmable gate array (FPGA), or other hardware component. The Filter Design HDL Coder also automatically creates VHDL, Verilog, and ModelSim test benches for simulating, testing, and verifying the generated code. The test bench feature increases confidence in the correctness of the generated code and saves time spent on test bench implementation. The test bench will be described below in more detail with reference to FIG. 3. Using the Filter Design HDL Coder, system architects and designers can spend more time on fine-tuning algorithm and models through simulation and less time on HDL coding.

Figure 3:
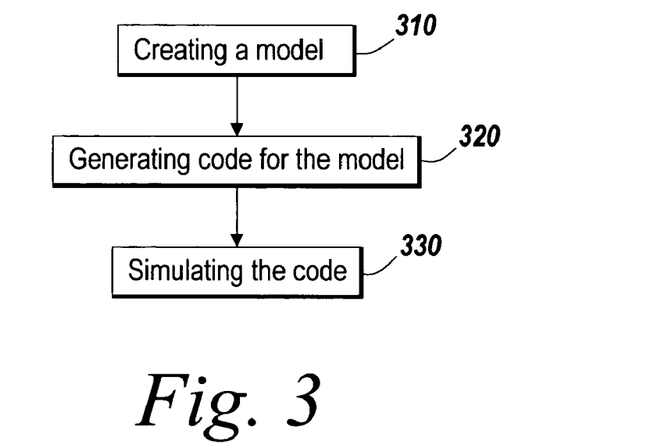
FIG. 3 is a flow chart showing an exemplary operation for generating code from a model in the illustrative embodiment of the present invention.

FIG. 3 depicts an exemplary operation for generating HDL code 240 from a model 220 in the illustrative embodiment of the present invention. The model 220 can be created using the user interface 210 in the environment 200 (step 310). The model 220 created in the environment 200 can be either a text-based or graphical model. The graphical model can be generated using a graphical model design tool, such as Simulink®. One of ordinary skill in the art will appreciate that the Simulink® is an illustrative modeling tool and the present invention may use other graphical model design tools, for example LabVIEW and Hyperception from National Instruments, Signal Processing WorkBench (SPW) from CoWare, VisualSim from Mirabilis Design, Rational Rose from IBM, etc. The text-based model can be generated using a text-based model design tool, such as Filter Design Toolbox. One of ordinary skill in the art will appreciate that the text-based model can be generated using other text-based model design tools.

Figure 4:
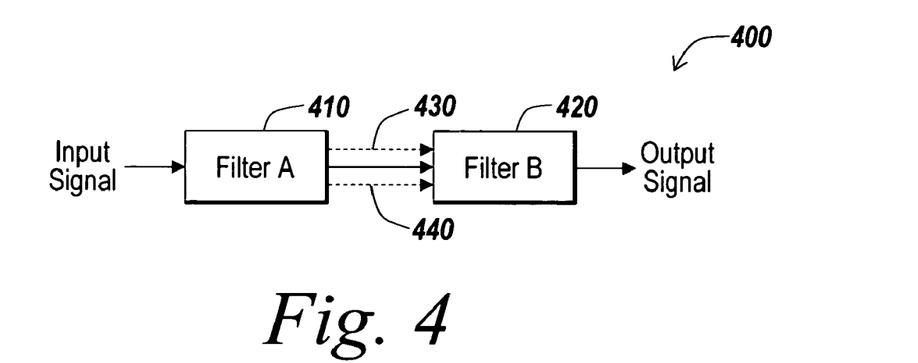
FIG. 4 shows an exemplary model from which hardware description language (HDL) code is generated in the illustrative embodiment of the present invention.

FIG. 4 is an exemplary model designed in the illustrative embodiment. The model 400 includes two components (or elements) including filter 410 and filter 420. The components of the model 400 depicted in FIG. 4 is illustrative and the model 400 can include more than two components or elements, and multiple interfaces for different portions of the model 400.

Referring back to FIG. 3, the code generator 230 generates HDL code 240 from the model 220 (step 320). When the HDL code 240 is generated for the model 240, such as the model 400 having filter 410 and filter 420 as its components, component interfaces between the components of the model 220 are also generated. Sometimes component interfaces have signals that are not specifically depicted to a user in the displayed representation of the model 400. Such signals may include, but are not limited to various types of control signals, for example:

(1) reset signal 430 (dotted line in FIG. 4);
(2) clock-enable signal 440 (dotted line in FIG. 4);
(3) bidirectional flow-control handshake signals; and
(4) other like control signals.

These signals are added to the component interfaces by the code generator 230 in the process of generating the HDL code from the model 220 to facilitate the synthesis of an actual hardware system, such as a FPGA and an ASIC. Those of ordinary skill in the art will appreciate that the control signals set forth above are illustrative and the component interfaces may include other signals that can be used to control data flow between components. The component interfaces include information representing signals transferred between the components, which are specifically depicted in the displayed representation of the model 400, and control signals performing the flow-control of data between the components.

Figure 5:
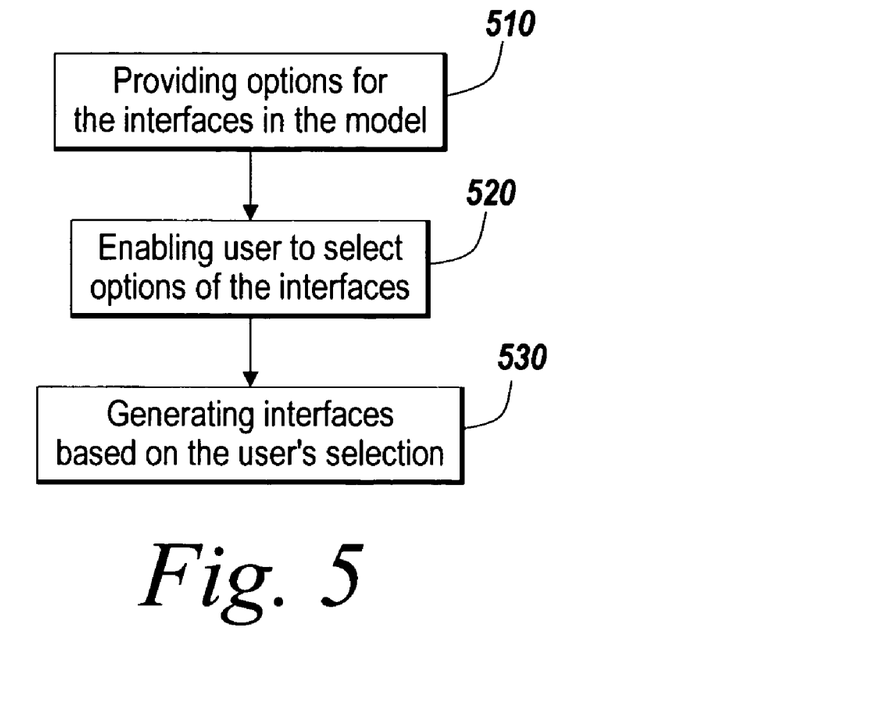
FIG. 5 is a flow chart showing an exemplary operation for generating interfaces between components or elements in the model depicted in FIG. 4.

FIG. 5 is a flow chart showing an exemplary operation for generating a component interface between filter 410 and filter 420 in the model 400. First, the environment 200 may provide users with options for selecting the types or styles of the component interfaces via the user interface 210 (step 510). The interface types or styles may define different characteristics for the component interfaces in the model 440. The interface types or styles may define how data is transferred between the components in the model. The options for the interface types or styles may include:

(1) an interface where the input and output data are transferred every clock cycle;
(2) an interface where the input data is transferred every clock cycle but the output is flow-controlled by an output enable signal;
(3) an interface where the input and output data transfer is flow-controlled by a clock enable input signal;
(4) an interface where the input and output data transfer is flow-controlled by a clock gating signal;
(5) a serial interface where the input and output data are transferred one bit per clock cycle; and
(6) an interface with a unidirectional flow-control;
(7) an interface with a bidirectional flow-control;
(8) an interface with a single clock;
(9) an interface with multiple clocks; and
(10) many other interface types or styles.

Those of ordinary skill in the art will appreciate that the interface types set forth above are illustrative and other types of interfaces can be may be included to define different characteristics for the interfaces.

The users may be able to select one or more options for the types or styles of the component interface between filter 410 and filter 420 in the model 400 (step 520). If multiple types or styles are selected, a final type or style of the interface can be determined using a balancing algorithm, such as a cost function, for the real hardware implementation of the model 400. In the illustrative embodiment, the selection of the interface types or styles may be directly controlled by the user using the user interface 210. In another embodiment, the selection of the interface types or styles may also be inferred from other parameters for the model 400.

One of ordinary skill in the art will appreciate that the model 400 is illustrative and the present invention may apply to a model that includes multiple interfaces for different portions of the model. One of ordinary skill in the art will also appreciate that the user interface 210 may enable the users to select options for the types or styles of the multiple interfaces.

Figure 6:
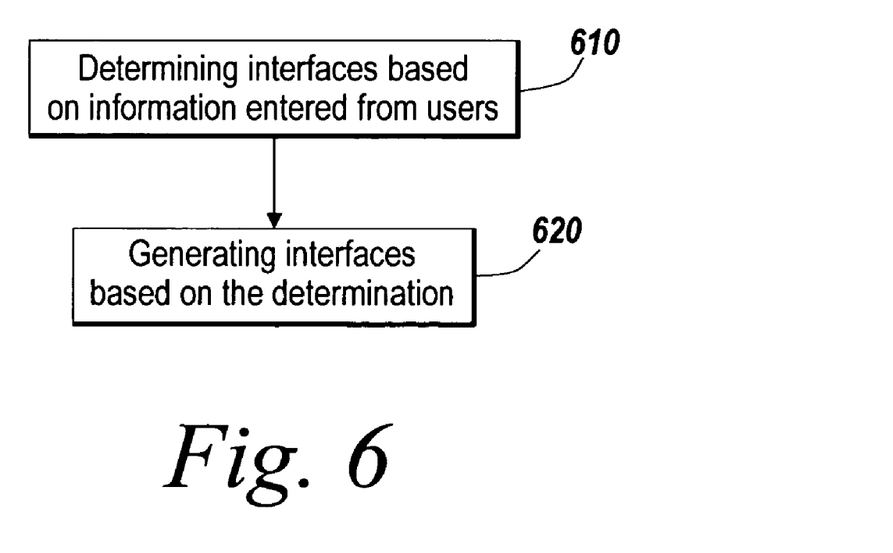
FIG. 6 is a flow chart showing another exemplary operation for generating interfaces between components or elements in the model depicted in FIG. 4.

FIG. 6 is a flow chart showing another exemplary operation for generating code for a component interface between filter 410 and filter 420 in the model 400. The selection of the interface types or styles may be inferred from other parameters for the model 400, such as implementation parameters that the users have entered (step 610). The HDL code 240 can be generated to comply with one or more implementation parameters including but not limited to:

(1) various power requirements;
(2) various clock rates;
(3) size constraints; and
(4) a weighted combination of implementation parameters.

The various power requirements may include the amount of power that can be consumed in the implemented hardware system, the amount of input power than can be handled by the implemented hardware system, the amount of output power than can be produced by the implemented hardware system or any other power requirements relating to the implemented hardware system. The various clock rates may include a high speed clock rate, a low speed clock rate or any specific clock rate that can determine the speed of the implemented hardware system. The size constraints may determine the area of the implemented hardware system. Those of skill in the art will appreciate that the HDL code 240 can be generated to comply with a weighted combination of one or more implementation parameters.

Figure 7:
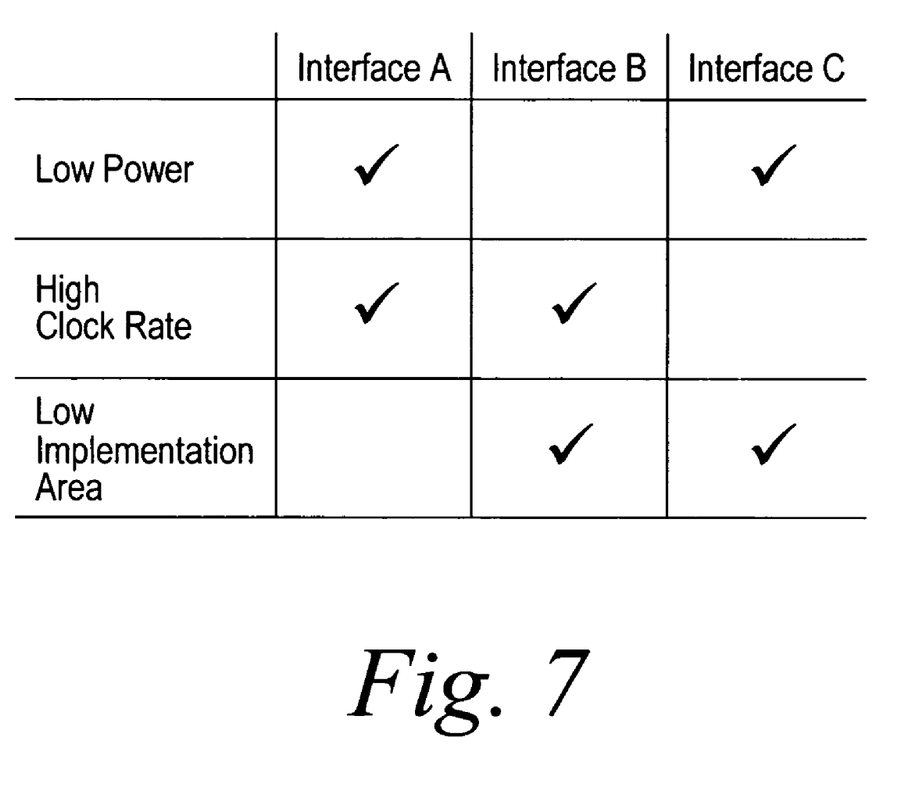
FIG. 7 is a table showing exemplary interfaces for the weighted combinations of implementation parameters.

FIG. 7 depicts exemplary interfaces for the weighted combination of the implementation parameters. HDL code 240 for Interface A can be generated to increase the clock speed and decrease the power consumption while HDL code 240 for Interface B can be generated to increase the clock speed and decrease the implementation area. HDL code for Interface C can be generated to decrease the power consumption and the implementation area. Interfaces A, B and C have multiple types or styles, such as the clock speed, power consumption, and implementation area. A cost function that gives a cost measure can be used to determine the final type or style of the interface for the hardware implementation. Those skilled in the art will appreciate the implementation parameters listed above are illustrative and other parameters may be considered to determine the type or style of the component interface. Those skilled in the art will appreciate the combinations of the implementation parameters depicted in FIG. 7 are also illustrative and other combinations may be considered to determine the type or style of the component interface. If the users input the implementation parameters, the code generator 230 may determine the type or style of the component interface from the implementation parameters.

In a circuit implementation, goals may differ in different parts of the system. Thus, more than one goal may be specified for a given circuit, and different interface styles may be simultaneously employed within the circuit.

Referring back to FIGS. 5 and 6, if the type or style of the component interface is determined, the code generator 230 generates the HDL code 240 for the component interface between filter 410 and filter 420 based on the interface type or style (step 530 in FIG. 5 and step 620 in FIG. 6). In the process of generating the component interface that complies with the determined interface type or style, the attributes of filter 410 and filter 420 are propagated programmatically throughout the model 400. For each of the components, a method forces the component to evaluate all of its parameters. This method is called for all components in the model. During the propagation, the attributes of signals, such as reset signals and clock-enable signals, in the component interfaces are determined on the basis of the attributes of components that are connected to each other and the determined interface type or style. For example, the attributes of the interface between filter 410 and filter 420 are determined on the basis of the attributes of filter 410 and filter 420 and the interface type or style of the component interface between filter 410 and filter 420. One of ordinary skill in the art will appreciate that the component interface may be implemented using a data structure wherein the data structure is filled with the attributes of the component interface. An exemplary data structure is disclosed in a copending U.S. patent application Ser. No. 10/414,644 entitled "A SYSTEM AND METHOD FOR USING EXECUTION CONTEXTS IN BLOCK DIAGRAM MODELING," which is incorporated herewith by reference.

Referring back to FIG. 3, the generated HDL code 240 may be simulated to verify the results of the HDL code 240 (step 330). Users may simulate the HDL code 240 using a HDL code simulation tool, such as ModelSim from Mentor Graphics Corporation of Wilsonville, Oreg. The HDL code 240 may be verified using a test bench generated by the code generator 230. In order to verify the functionality of the generated HDL code, the code generator 230 may generate the test bench in many forms including: VHDL or Verilog HDL code written at a behavioral level; a Simulink® diagram; a MATLAB® function called via a co-simulation interface; a scripting language files such as a TCL file for the simulation tool; and an industry standard value-change-dump (VCD) file that gives inputs, outputs, and the times each are valid. To simulate the generated HDL code 240, users may start the simulation tool and compile the generated HDL code 240 and test bench files in the simulation tool. The test bench connects to top-level of the generated HDL code. The test bench drives the primary inputs for testing, such as sampled data for a filter or Ethernet packets, and the ancillary inputs for control, such as the clock, the reset, the clock enable and the control inputs. The test bench checks or verifies whether the outputs are the correct values at any or all instant of time.

It will thus be seen that the invention attains the objectives stated in the previous description. Since certain changes may be made without departing from the scope of the present invention, it is intended that all matter contained in the above description or shown in the accompanying drawings be interpreted as illustrative and not in a literal sense. For example, the illustrative embodiment of the present invention may be practiced in any other programming/modeling environment that provides for the synchronization of actions in a model. Practitioners of the art will realize that the sequence of steps and architectures depicted in the figures may be altered without departing from the scope of the present invention and that the illustrations contained herein are singular examples of a multitude of possible depictions of the present invention.

We claim:

1. In a computing device, a method for generating code from a model for a hardware implementation of the model, the method comprising:
   providing, via a processing unit associated with the computing device, a plurality of interface types for an interface between two components of the model, each of the plurality of interface types including size, clock, and power parameters for the model, the plurality of interface types further including at least two of:
   a first interface type where input data and output data are transferred cyclically,
   a second interface type where input data is transferred cyclically and output data is flow controlled by a signal to enable output,
   a third interface type where input data and output data transfer are flow controlled by a signal to enable a clock,
   a fourth interface type where input data and output data transfer are flow controlled by a signal to activate a clock,
   a fifth interface type where a first amount of input data and a second amount of output data are transferred per clock cycle,
   a sixth interface type where flow control is unidirectional,
   a seventh interface type where flow control is bidirectional,
   an eighth interface type that includes a single clock, or
   a ninth interface type that includes multiple clocks;
   receiving, via the processing unit, at least two selections, from the provided plurality of interface types, for the interface between the two components;
   determining, via the processing unit and from the at least two selections from the provided plurality of interface types, an interface type, for the interface between the two components, using a balancing algorithm and a weighted combination of the size, power, and clock parameters for the model; and
   automatically generating, via the processing unit, code representative of the determined interface type for the interface between the two components.

2. The method of claim 1, where the generated code comprises Hardware Description Language (HDL) code.

3. The method of claim 1, where the model comprises a graphical model having at least one block representation.

4. The method of claim 1, where the model comprises a text based model.

5. The method of claim 1, where the determined interface type includes information on a data transfer between a portion of a first component of the model and a portion of a second component of the model.

6. The method of claim 5, where the determined interface type includes information on the data transfer and information on a control of the data transfer.

7. The method of claim 5, where the determined interface type includes attributes of at least one of a reset signal, a clock signal or a clock-enable signal to control the data transfer between the portion of the first component of the model and the portion of the second component of the model.

8. The method of claim 1, where determining an interface type further comprises:
   providing one or more options for selecting types of the interface; and
   enabling a user to select at least one of the types of the interface from the one or more options.

9. The method of claim 1, where determining an interface type further comprises:
   determining a type of the interface from parameters of the model.

10. The method of claim 9, where the parameters of the model define a hardware implementation of the model.

11. A system for generating code from a model for a hardware implementation of the model, the system comprising:
    a user interface to:
    provide a plurality of interface types for an interface between two components of the model, each of the plurality of interface types including size, clock, and power parameters for the model, the provided plurality of interface types further including at least two of:
    a first interface type where input data and output data are transferred cyclically,
    a second interface type where input data is transferred cyclically and output data is flow controlled by a signal to enable output,
    a third interface type where input data and output data transfer are flow controlled by a signal to enable a clock,
    a fourth interface type where input data and output data transfer are flow controlled by a signal to activate a clock,
    a fifth interface type where a first amount of input data and a second amount of output data are transferred per clock cycle,
    a sixth interface type where flow control is unidirectional, a seventh interface type where flow control is bidirectional,
an eighth interface type that includes a single clock, or
a ninth interface type that includes multiple clocks,
receive a selection of at least two of the provided plurality of interface types, for the interface between the two components, and
determine an interface type for the interface between the two components, from the selection of the at least two interface types, based on a balancing algorithm and on a weighted combination of the size, power, and clock parameters for the model; and
a code generator to automatically generate code representative of the determined interface type.

12. The system of claim 11, where the generated code comprises Hardware Description Language (HDL) code.

13. The system of claim 11, where the model comprises a graphical model having at least one block representation.

14. The system of claim 11, where the model includes a text-based model.

15. The system of claim 11, where the determined interface type includes information on a data transfer between a portion of a first component of the model and a portion of a second component of the model.

16. The system of claim 15, where the determined interface type is implemented as a data structure that contains information on the data transfer between the portion of the first component of the model and the portion of the second component of the model.

17. The system of claim 11, where the determined interface type includes attributes of at least one of a reset signal, a clock signal or a clock-enable signal that controls a data transfer between the portion of the first component of the model and the portion of the second component of the model.

18. The system of claim 11, where the user interface provides one or more options for selecting types of the interface and enables a user to select at least one of the types of the interface based on the provided options.

19. The system of claim 11, where the code generator determines a type of the interface from one or more parameters for the model.

20. The system of claim 19, where the parameters for the model include one or more hardware implementation parameters of the model.

21. A system to generate code from a model for a hardware implementation of the model, the system comprising:
a processor to:
provide a user interface to:
select multiple interface types for an interface of a portion of the model, the interface interfacing with two or more components in the portion of the model, an interface type including size, clock, and power parameters for the model, the multiple interface types further including at least two of:
a first interface type where input data and output data are transferred cyclically,
a second interface type where input data is transferred cyclically and output data is flow controlled by a signal to enable output,
a third interface type where input data and output data transfer are flow controlled by a signal to enable a clock,
a fourth interface type where input data and output data transfer are flow controlled by a signal to activate a clock,
a fifth interface type where a first amount of input data and a second amount of output data are transferred per clock cycle,
a sixth interface type where flow control is unidirectional,
a seventh interface type where flow control is bidirectional,
an eighth interface type that includes a single clock, or
a ninth interface type that includes multiple clocks, and
determine one determined interface type for the interface from the selected multiple interface types based on a balancing algorithm and on a weighted combination of the size, power, and clock parameters for the model; and
generate code representative of the interface based on the one determined interface type.

22. A computer program product for holding instructions executable in at least one computer to generate code from a model, the instructions comprising:
one or more instructions to provide a user interface to select multiple interface types for an interface between a portion of a first component of the model and a portion of a second component of the model, an interface type including size, clock, and power parameters for the model, the multiple interface types further including at least two of:
a first interface type where input data and output data are transferred cyclically,
a second interface type where input data is transferred cyclically and output data is flow controlled by a signal to enable output,
a third interface type where input data and output data transfer are flow controlled by a signal to enable a clock,
a fourth interface type where input data and output data transfer are flow controlled by a signal to activate a clock,
a fifth interface type where a first amount of input data and a second amount of output data are transferred per clock cycle,
a sixth interface type where flow control is unidirectional,
a seventh interface type where flow control is bidirectional,
an eighth interface type that includes a single clock, or
a ninth interface type that includes multiple clocks;
one or more instructions to determine one determined interface type, from the selected multiple interface types, based on a balancing algorithm and on a weighted combination of size, power, and clock parameters for the model; and
one or more instructions to automatically generate code representative of the interface between the portion of the first component and the portion of the second component of the model based on the one determined interface type.

23. The computer program product of claim 22, where the generated code includes Hardware Description Language (HDL) code.

24. The computer program product of claim 22, where the model includes a graphical model having at least one block representation.

25. The computer program product of claim 22, where the model includes a text-based model.

26. The computer program product of claim 22, where the interface comprises information on a data transfer between the portion of the first component of the model and the portion of the second component of the model.

27. The computer program product of claim 22, where the interface is implemented as a data structure that contains information on a data transfer between the portion of the first component of the model and the portion of the second component of the model.

28. The computer program product of claim 22, where the interface comprises attributes of at least one of a reset signal, a clock signal or a clock-enable signal that controls data transfer between the portion of the first component of the model and the portion of the second component of the model.

29. The computer program product of claim 22, where the one or more instructions to provide a user interface for selecting further comprises:
  one or more instructions to provide one or more options for selecting types of the interface; and
  one or more instructions to enable one or more users to select at least one of the types of the interface based on the options.

30. The computer program product of claim 29, where the one or more instructions to provide one or more options further comprises:
  one or more instructions to provide at least one of types of the interface where:
  data is transferred cyclically,
  data transfer is flow-controlled by a control signal, or
  a particular amount of data is transferred per clock cycle.

31. The computer program product of claim 29, where the one or more instructions to provide one or more options further comprises:
  one or more instructions to provide at least one of types of the interface with a unidirectional flow-control, or with a bidirectional flow-control.

32. The computer program product of claim 29, where the one or more instructions to provide one or more options further comprises:
  one or more instructions to provide at least one of types of the interface with a single clock signal or with multiple clock signals.

33. The computer program product of claim 22, where the one or more instructions to provide a user interface for selecting further comprises:
  one or more instructions to determine a type of the interface from one or more parameters for the model.

34. The computer program product of claim 33, where the parameters for the model includes one or more hardware implementation parameters of the model.

35. The computer program product of claim 34, where the parameters for hardware implementation of the model comprise at least one of one or more power requirements parameters, one or more clock rates parameters, and one or more size constraints parameters.

36. The computer program product of claim 34, where the parameters for hardware implementation of the model comprise a weighted combination of one or more power requirements parameters, one or more clock rates parameters, and one or more size constraints parameters.

37. A computer program product for holding instructions executable in a computer to generate code from a model, the instructions comprising:
  one or more instructions to select multiple interface types for each of a plurality of interfaces for a plurality of portions of the model, each of the plurality of interfaces interfacing with components in a different portion of the model, an interface type including size, clock, and power parameters for the model, the multiple interface types further including at least two of:
    a first interface type where input data and output data are transferred cyclically,
    a second interface type where input data is transferred cyclically and output data is flow controlled by a signal to enable output,
    a third interface type where input data and output data transfer are flow controlled by a signal to enable a clock,
    a fourth interface type where input data and output data transfer are flow controlled by a signal to activate a clock,
    a fifth interface type where a first amount of input data and a second amount of output data are transferred per clock cycle,
    a sixth interface type where flow control is unidirectional,
    a seventh interface type where flow control is bidirectional,
    an eighth interface type that includes a single clock, or
    a ninth interface type that includes multiple clocks;
  one or more instructions to determine, from the multiple interface types, an interface type for each of the plurality of interfaces, where the interface type is determined based on a balancing algorithm and on a weighted combination of the size, power, and clock parameters for the model; and
  one or more instructions to automatically generate code representative of the plurality of interfaces for the plurality of portions of the model based on the determined interface type associated with each of the plurality of interfaces.

* * * * *

UNITED STATES PATENT AND TRADEMARK OFFICE
CERTIFICATE OF CORRECTION

| | | |
|---|---|---|
| PATENT NO. | : 7,913,222 B2 | Page 1 of 1 |
| APPLICATION NO. | : 11/012936 | |
| DATED | : March 22, 2011 | |
| INVENTOR(S) | : Ogilvie et al. | |

It is certified that error appears in the above-identified patent and that said Letters Patent is hereby corrected as shown below:

Title Page, Item (75), please correct "Venkateraman" to --Venkataraman--.

Signed and Sealed this

Third Day of May, 2011

David J. Kappos
*Director of the United States Patent and Trademark Office*